(12) United States Patent
Ober et al.

(10) Patent No.: US 8,415,081 B2
(45) Date of Patent: Apr. 9, 2013

(54) PHOTOSENSITIVE RESIN COMPOSITION HAVING A HIGH REFRACTIVE INDEX

(75) Inventors: Christopher K. Ober, Ithaca, NY (US); Yasuharu Murakami, Ibaraki (JP)

(73) Assignees: Cornell Research Foundation, Inc., Ithaca, NY (US); Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/570,733

(22) PCT Filed: Jun. 17, 2004

(86) PCT No.: PCT/US2004/016620
§ 371 (c)(1),
(2), (4) Date: Feb. 21, 2007

(87) PCT Pub. No.: WO2006/009526
PCT Pub. Date: Jan. 26, 2006

(65) Prior Publication Data
US 2008/0038665 A1    Feb. 14, 2008

(51) Int. Cl.
*G03F 7/004*    (2006.01)
*G03F 7/038*    (2006.01)
*B29C 35/08*    (2006.01)

(52) U.S. Cl. .................. 430/270.1; 430/269; 430/280.1; 430/914; 430/921; 430/925; 430/919; 264/401

(58) Field of Classification Search ........................ None
See application file for complete search history.

(56) References Cited

U.S. PATENT DOCUMENTS

| | | | | |
|---|---|---|---|---|
| 3,926,660 A * | 12/1975 | Holle et al. | ..................... | 106/430 |
| 5,091,011 A * | 2/1992 | DeLuca, Jr. | ................... | 106/417 |
| 6,190,833 B1 | 2/2001 | Shiota | | |
| 6,528,595 B1 * | 3/2003 | Ikawa et al. | .................... | 525/525 |
| 6,808,865 B1 * | 10/2004 | Morigaki et al. | .......... | 430/280.1 |
| 7,297,460 B2 * | 11/2007 | Vanmaele et al. | ......... | 430/270.1 |
| 7,361,709 B2 * | 4/2008 | Tanaka et al. | .................. | 524/556 |
| 2001/0047043 A1 * | 11/2001 | Okoroafor et al. | .............. | 522/31 |

* cited by examiner

*Primary Examiner* — Sin J. Lee
(74) *Attorney, Agent, or Firm* — William A Blake

(57) ABSTRACT

The present invention discloses a photosensitive resin composition which comprises (A) a compound having a molecule with at least one thiirane ring and a total number of a thiirane ring and/or an epoxy ring of at least 2 in the molecule, and (B) a photo acid generator, said composition having a refractive index of at least 1.6, and a method of obtaining a high refractive index periodical structure which comprises subjecting the photosensitive resin composition to photolithography.

30 Claims, 1 Drawing Sheet

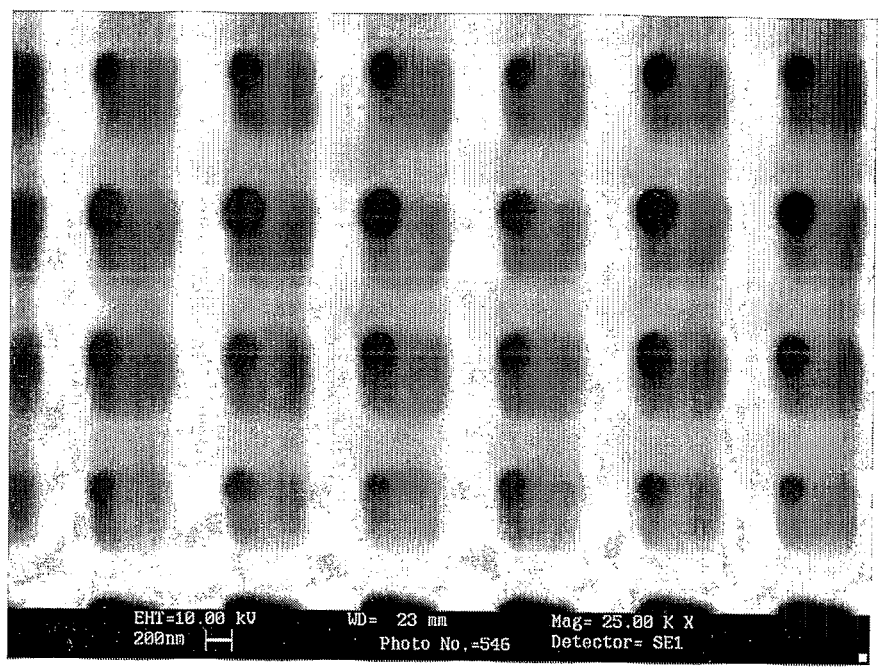

PHOTOSENSITIVE RESIN COMPOSITION HAVING A HIGH REFRACTIVE INDEX

BACKGROUND OF THE INVENTION

1. Field of the Invention

The present invention relates to a photosensitive resin composition and an optical material using the same. More specifically, it also relates to a refractive index periodical structure, and a process for preparing the same, requiring a refractive index of at least 1.7, which is used in the field of photonics, electromagnetic wave technology, micromachine technology, microreactor technology, and the like.

2. Description of Related Art

A refractive index periodical structure having a periodical distribution of a refractive index shows a diffraction/interference action to an electromagnetic wave, and prohibits propagation of the electromagnetic wave within a specific frequency region. This phenomenon corresponds to a band structure of electrons in a semiconductor crystal. Such a refractive index periodical structure is generally called a photonic crystal. And, a frequency band region in which propagation is prohibited is called a photonic band gap.

IT industries flourishing at the end of the 20$^{th}$ century have been supported by electronics technology based on semiconductor materials which control electrons, but are now faced with an essentially critical situation regarding technology. To further develop the technology in the 21$^{st}$ century, it is indispensable to transfer the technological viewpoint to a photonics technology to overcome the limitations of the electronics technology.

Photonic crystals can control an electromagnetic wave; thereby obtaining a position to be a key material in the photonics technology similar to the position of semiconductor material in the electronics technology. Photonic crystals are expected to be important elements for realizing optical devices of the next generation such as ultra-high efficiency lasers, microminiature optical integrated circuits, and other useful devices.

In order for the photonic crystal to function effectively, it is necessary to control the periodical structure with a space scale that is the same as the wavelength of an electromagnetic wave, and obtain a predetermined value for a refractive index ratio of a high refractive index phase and a low refractive index phase. A minimum or lowest refractive index ratio to be required may vary depending on the form of the periodical structure, and a larger value is generally preferred.

In the field of photonics, an object generally has a wavelength region from a visible light region to a near infrared region. Therefore, photonic crystals are generally prepared having a period from a submicron to a micron order. As a method to realize this, for example, a method has been disclosed by Lin et al. for preparing woodpile (blocks) state photonic crystals in which square pieces made of Si have been integrated with an interval of several microns by making full use of the semiconductor fine processing technology {Nature, Vol. 394, pp. 251-253 (1998)}. Also, a wafer fusion technique has been disclosed by Noda et al. as a method for preparing woodpile state photonic crystals in which square pieces made of GaAs or InP have been integrated with an interval of several microns {App. Phys. Lett., Vol. 75, pp. 905-907 (1999)}. Moreover, Kawakami et al. succeeded in preparing submicron order photonic crystals having a specific three-dimensional periodical structure comprising Si and $SiO_2$ using an original bias sputter build-up/etching method called a self-cloning method {Electron. Lett., Vol. 33, pp. 1260-1261 (1997)}. Furthermore, Vos et al. prepared submicron order inverse opal type photonic crystals by building up titania in a space of an opal structure due to the self-assembling of monodispersed fine particles made of polystyrene according to the sol-gel method, and removing the polystyrene fine particles as molds by calcination simultaneously with calcination of the titania {Science, Vol. 281, pp. 802-804 (1998)}. Also, Misawa et al. prepared submicron order woodpile state photonic crystals comprising a photosetting resin by a two-photon absorption lithography process {Appl. Phys. Lett., Vol. 74, pp. 786-788 (1999)}.

However, the above-identified methods each have their problems. The method of Lin et al. comprises many steps using complicated semiconductor fine processing techniques. The method requires the use of large sized apparatuses resulting in low productivity, high costs, and the like, and not many types of materials can be applied to the method. Thus, it cannot be said to be a general method. The method of Noda et al. is an extremely excellent method since materials to be applied to the method are abundant and flexibility and the structure is large. However, extremely severe conditions such as heating at 700° C. under a hydrogen atmosphere have been employed to carry out wafer fusion, resulting in safety concerns associated with this method. The method of Kawakami et al. is also an extremely excellent method since materials to be applied to the method are abundant and productivity is high. However, it involves a serious problem that only a specific structure can be prepared and it cannot be applied to general use.

Opal type and inverse opal type photonic crystals can be extremely easily prepared, and have been widely used in research activities of laboratories. However, these crystals have a low flexibility in structure, so that a certain breakthrough in a preparation method would be indispensable to make a device. Also, from theoretical calculation, in an opal type and an inverse opal type photonic crystals, it is expected that refractive index conditions required to form a complete photonic band gap are extremely severe compared to those required in the woodpile state photonic crystals. Thus, they are disadvantageous from the point of flexibility in selecting materials. Also, in the inverse opal type photonic crystals, it is necessary to fill a material having a high refractive index into gaps of an opal mold.

However, this produces problems since it is difficult to fill the material into fine three-dimensional gaps uniformly and molds deform during the accompanying filling.

As a method of preparing photonic crystals using a photo-curing resin, it has been proposed to use a usual optical modeling method in addition to the method using the above-mentioned two-photon absorption lithography. In this method, a fine structure can be easily obtained, but the refractive index of the resin is low, at most 1.6 or so, so there is a problem in that a large refractive index ratio cannot be obtained.

BRIEF SUMMARY OF THE INVENTION

The present invention is a photosensitive resin composition which comprises (A) a compound having a molecule with at least one thiirane ring, and a total number of a thiirane ring and/or an epoxy ring of at least 2 in the molecule, (B) a photo acid generator, and optionally (C) a plurality of fine particles having a refractive index of at least 2.0 and an average particle size of 1 to 100 nm. The present invention also includes the formation of a high refractive index periodical structure using the photosensitive resin composition.

A refractive index periodical structure having a large difference in refractive index is prepared by subjecting the photosensitive resin composition having a refractive index of at least 1.6 to a rapid prototyping.

Optionally, a photosensitive resin composition having a refractive, index of at least 1.7 is formed by adding a plurality of fine particles having a refractive index of at least 2.0 to the photosensitive resin composition of the present invention.

A high refractive index periodical structure is obtained by subjecting the photosensitive resin composition having a refractive index of at least 1.7 to photolithography.

BRIEF DESCRIPTION OF THE DRAWING

The features and advantages of the present invention will become apparent from the following detailed description of a preferred embodiment thereof, taken in conjunction with the accompanying drawing, in which:

FIG. 1 is an SEM image of a photonic crystal structure fabricated by two-photon lithography using a photosensitive resin composition including (A) thiirane-modified BREN-S and (B) diphenyl iodonium hexafluoroantimonate/3-(2'-benzimidazolyl)-7-N,N-diethyl-aminocoumarine.

DETAILED DESCRIPTION OF THE INVENTION

A photosensitive resin composition comprises (A) a compound having a molecule with at least one thiirane ring and a total number of a thiirane ring and/or an epoxy ring of at least 2 in the molecule, and (B) a photo acid generator. Optionally, the photosensitive resin composition may include (C) a plurality of fine particles, depending on a desired refractive index of the photosensitive resin composition.

A process for preparing the molecule with at least one thiirane ring is not specifically limited so long as it can synthesize the compound. A preferred preparation process may include a method in which an epoxy ring of a corresponding epoxy compound to be used as a starting material is converted into a thiirane ring by using a sulfide according to methods known by a person skilled in the art. Here, "the corresponding epoxy compound" means a compound in which a sulfur atom of the thiirane ring in an episulfide compound is substituted by an oxygen atom. Preferred sulfides may include a thiourea, a thiocyanate, and the like. Of these, thiourea and potassium thiocyanate are particularly preferred. The process should not be specifically limited to the number of epoxy rings converted into thiirane rings. More specifically, a method disclosed in, for example, J. M. Charlesworth, J. Polym. Sci. Polym. Phys., 17, 329 (1979) that uses a thiocyanate, or a method disclosed in, R. D. Schuetz et al, J. Org. Chem., 26, 3467 (1961) that uses thiourea may be used.

Examples of the epoxy compound having two or more epoxy groups in the molecule include, but are not limited to, a commercially available bisphenol A type epoxy resin such as Epikote 1001, 1002, 1003, 1004, 1007, 1009, 1010, 828 (all available from Japan Epoxy Resin Co., Ltd.); a commercially available bisphenol F type epoxy resin such as Epikote 807(available from Japan Epoxy Resin Co., Ltd.); a commercially available phenol novolac type epoxy resin such as Epikote 152 and 154 (both available from Japan Epoxy Resin Co., Ltd.), EPPN201 and 202 (both available from NIPPON KAYAKU CO., LTD.); a commercially available cresol novolac type epoxy resin such as EOCN-102, 103S, 104S, 1020, 1025, 1027, and Epikote 180S75(available from Japan Epoxy Resin Co., Ltd.); a commercially available brominated phenol novolac type epoxy resin such as BREN-105, 304 and S (all available from NIPPON KAYAKU CO., LTD.); a commercially available cyclic aliphatic epoxy resin such as CY-75, 177, 179 (all available from CIBA SPECIALITY CHEMICALS), ERL-4234, 4299, 4221, 4206(available from U.C.C.), EPICLON 200, 400 (both available from DAINIPPON INK AND CHEMICALS, INCORPORATED), Epikote 871, 872 (both available from Japan Epoxy Resin Co., Ltd.), and the like. Of these compounds, the bisphenol A type epoxy resin, the bisphenol F type epoxy resin, the phenol novolac type epoxy resin, the cresol novolac type epoxy resin or the aliphatic polyglycidyl ether are preferably used in view of the absence of coloring after heat treatment.

Most of the epoxy compounds mentioned above are high molecular weight compounds, but the epoxy compound is not specifically limited by the molecular weight thereof, and, for example, a low molecular weight compound such as glycidyl ether of bisphenol A or bisphenol F may be used.

A photo acid generator preferably in the form of an acid generation type cationic polymerization initiator, such as conventionally known sulfonium salt, iodonium salt, phosphonium salt, diazonium salt, ammonium salt and ferrocene, are used. In the following, specific examples are mentioned but the present invention is not limited by these compounds.

As a sulfonium salt series acid generation type cationic polymerization initiator, examples include, but are not limited to, bis[4-(diphenylsulfonio)phenyl]sulfide bishexafluorophosphate, bis[4-(diphenylsulfonio)phenyl]sulfide bishexafluoroantimonate, bis[4-(diphenylsulfonio)phenyl] sulfidebistetrafluoroborate, bis[4-(diphenylsulfonio)phenyl] sulfide tetrakis(pentafluorophenyl) borate, diphenyl-4-(phenylthio)phenylsulfonium hexafluorophosphate, diphenyl-4-(phenylthio) phenylsulfonium hexafluoroantimonate, diphenyl-4-(phenylthio)phenylsulfonium tetrafluoroborate, diphenyl-4-(phenylthio)phenylsulfonium tetrakis(pentafluorophenyl)borate, triphenylsulfonium hexafluorophosphate, triphenylsulfonium hexafluoroantimonate, triphenylsulfonium tetrafluoroborate, triphenylsulfonium tetrakis(pentafluorophenyl)borate, bis[4-(di-(4-(2-hydroxyethoxy)) phenylsulfonio)phenyl]sulfide bishexafluorophosphate, bis[4-(di-(4-(2-hydroxyethoxy)) phenylsulfonio)phenyl]sulfide bishexa-fluoroantimonate, bis[4-(di-(4-(2-hydroxyethoxy)) phenylsulfonio)phenyl] sulfidebistetrafluoroborate, and bis [4-(di-(4-(2-hydroxyethoxy)) phenylsulfonio)phenyl]sulfide tetrakis(pentafluoro-phenyl)borate.

As the iodonium salt series acid generation type cationic polymerization initiator, examples include, but are not limited to, diphenyl iodonium hexafluorophosphate, diphenyl iodonium hexafluoroantimonate, diphenyl iodonium tetrafluoroborate, diphenyl iodonium tetrakis(pentafluorophenyl)borate, bis(dodecylphenyl)iodonium hexafluorophosphate, bis-(dodecylphenyl)iodonium hexafluoroantimonate, bis(dodecylphenyl)iodonium tetrafluoroborate, bis(dodecylphenyl)iodonium tetrakis(pentafluorophenyl)borate, 4-methylphenyl-4-(1-methyl-ethyl)phenyl iodonium hexafluorophosphate, 4-methylphenyl-4-(1-methylethyl) phenyl iodonium hexafluoroantimonate, 4-methylphenyl-4-(1-methylethyl) phenyl iodonium tetrafluoroborate, and 4-methylphenyl-4-(1-methylethyl)phenyl iodonium tetrakis (pentafluorophenyl)borate.

As the phosphonium salt series acid generation type cationic polymerization initiator, examples include, but are not limited to, ethyltriphenylphosphonium tetrafluoroborate, ethyltriphenylphosphonium hexafluorophosphate, ethyltriphenylphosphonium hexafluoro-antimonate, tetrabutylphosphonium tetrafluoroborate, tetrabutylphosphonium hexafluorophosphate, and tetrabutylphosphonium hexafluoroantimonate.

As the diazonium salt series acid generation type cationic polymerization initiator, examples include, but are not limited to, phenyldiazonium hexafluorophosphate, phenyldiazonium hexafluoroantimonate, phenyldiazonium tetrafluoroborate, and phenyldiazonium tetrakis(pentafluorophenyl) borate.

As the ammonium salt series acid generation type cationic polymerization initiator, examples include, but are not limited to, 1-benzyl-2-cyanopyridinium hexafluorophosphate, 1-benzyl-2-cyanopyridinium hexafluoroantimonate, 1-benzyl-2-cyanopyridinium tetrafluoroborate, 1-benzyl-2-cyanopyridinium tetrakis(pentafluorophenyl)borate, 1-(naphthylmethyl)-2-cyanopyridinium hexafluorophosphate, 1-(naphthylmethyl)-2-cyanopyridinium hexafluoroantimonate, 1-(naphthylmethyl)-2-cyanopyridinium tetrafluoroborate, and 1-(naphthylmethyl)-2-cyanopyridinium tetrakis(pentafluoro-phenyl)borate.

As the ferrocene series acid generation type cationic polymerization initiator, examples include, but are not limited to, (2,4-cyclopentadien-1-yl)[(1-methylethyl)benzene]-Fe (II) hexafluorophosphate, (2,4-cyclopentadien-1-yl)[(1-methylethyl)benzene]-Fe (II) hexafluoroantimonate, 2,4-cyclopentadien-1-yl)[(1-methylethyl)benzene]-Fe (II) tetra fluoroborate, and 2,4-cyclopentadien-1-yl)[(1-methylethyl)benzene]-Fe (II) tetrakis(pentafluorophenyl)borate.

Of these, the sulfonium salt and the iodonium salt series acid generation type cationic polymerization initiators are preferred from the viewpoints of curing rate, stability and economics. Incidentally, these photo acid generators may be used alone or in the co-presence of a sensitizer.

Examples of commercially available sensitizers may include, for example, SP-150, SP-170, CP-66, CP-77 available from Asahi Denka Co., Ltd.; CYRACURE-UVI-6990, UVI-6974 both available from Union Carbide; CI-2855, CI-2639 both available from Nippon Soda Co., Ltd.; "Irgacure 261" (available from Ciba Specialty Chemicals Inc. (2,4-cyclopentadien-1-yl)[(1-methylethyl)benzene]-Fe (II) hexafluorophosphate); "RHODORSIL 2074" (4-methylphenyl-4-(1-methylethyl)phenyl iodonium tetrakis(pentafluorophenyl)borate available from Rhone-Poulenc) and the like.

As the plurality of fine particles having a high refractive index, a metal oxide powder or a metal salt powder are preferred, including, but not limited to, titanium oxide (rutile), titanium oxide (anatase), potassium titanate, barium titanate, zirconium oxide, lead titanate, zinc sulfide, and zinc oxide is used. Of these, titanium oxide ($TiO_2$, refractive index; rutile: 2.76, anatase: 2.52), and zirconium oxide ($ZrO_2$, refractive index; 2.2) are preferred. The preferred plurality of fine particles has a refractive index of at least 2.0. Titanium oxide is particularly preferred from an industrial view point as well as circulation and costs.

The particle size of the plurality of fine particles is preferably as little as possible from the view point of transparency of the photosensitive resin composition which includes the fine particles. Preferably the photosensitive resin composition includes a plurality of fine particles with a secondary average particle diameter of 200 nm or less, more preferably 100 nm or less, and an average primary particle diameter of the plurality of fine particles to be used as a starting material is preferably 1 to 100 nm, more preferably 1 to 50 nm. If the particle diameter is larger than 100 nm, the photosensitive resin composition tends to be opaque to light having a wavelength more than 400 nm because of Rayleigh scattering. The plurality of fine particles which have an average primary particle diameter less than 1 nm are difficult to prepare due to technical limitation of nanopowder formation.

A surface treatment of the plurality of fine particles is preferred whereby the preferred metal oxide powder is coated with a metallic oxide compound, including, but not limited to, aluminum oxide, silicon oxide, and similar materials to provide dispersion stability in a polar solvent.

It is also preferred to use a dispersant to stabilize dispersibility of the plurality of fine particles in addition to the surface treatment of the plurality of fine particles. The dispersant may include various kinds of materials, including, but not limited to, those materials listed below.

An aqueous dispersant may preferably include the following types of material. As an inorganic compound, a polyphosphate is preferably used. Among the polyphosphates, a condensed phosphate such as a tripolyphosphate, a hexametaphosphate, a pyrophosphate, and similar polyphosphates, or a silicate, for example, sodium silicate, is more preferred. As a formalin condensate, a naphthalene sulfonate-formalin condensate, or a cresol sulfonate-formalin condensate is preferably used. As a polymer, a polyacrylate, an olefin-maleate copolymerized material, or an acryl-maleate copolymerized material is preferably used, and the polyacrylate is more preferably used. As a natural product-derived material, a lingo-sulfonate, a carboxymethylcellulose salt, cationized starch, cationized cellulose, gelatin, dextrin, soluble starch, or skim milk is preferably used, and the carboxymethylcellulose salt or gelatin is more preferably used.

As a nonionic dispersant, polyvinyl alcohol is a preferred dispersant.

As a non-aqueous dispersant, alkylbenzene sulfonate, sodium dioctylsulfosuccinate, a partially amidated or partially esterified product of an olefin/maleic anhydride copolymer, an alkylimidazoline, an alkyl amine acetate, an alkyldiamide, an alkylaliphatic acid salt or a rhodinic acid salt is preferably used.

As a dispersing medium, various kinds of solvents including water, an alcohol, a ketone, an ester, a halogenated hydrocarbon, an aromatic hydrocarbon, an amide, and an ether may be used singly or in combination.

In a dispersing step, the plurality of fine particles, such as the metallic oxide powder, and the dispersant and the dispersing medium are charged using a predetermined ratio. As a dispersing device, in addition to sand grinders, dyno-mills, ball mills, and the other various kinds of mixers, continuous system or batch system mixing devices, milling devices (i.e. mixing and kneading), and similar dispersing devices are preferably used. When a kind or an amount of the dispersant is not limited, the dispersing step can be carried out by using the usual various kinds of dispersing device. When an amount of the dispersant to be added is restricted to a little and a conventionally used dispersing device for a low viscosity liquid such as a sand grinder, a dyno-mill, or a ball mill is used, there is a limit in a final particle size after dispersion (i.e. an ultimate particle size), and this sometimes causes aggregation due to over-dispersion.

On the other hand, it is more preferred to prepare a fine particles-dispersant material by a method in which a milled material is prepared by using a milling device which can disperse a material having high viscosity with strong shear force and then diluting the material. It may be also possible to finely disperse a material by using a dispersing machine for general use, for example, sand mill, after milling and dilution. With regard to a milling device that can be preferably used in a system containing a little amount of a dispersant, there may be specifically mentioned, for example, a continuous kneader, an open kneader, a pressure kneader, a bunbury mixer, a three-roll mill, a planetary mixer, and the like. At the time of milling, by employing a method in which a dispersing medium is first added in a slightly excessive amount to the above-mentioned composition, and after preparing a composition with thick concentration, an amount of the milling material is decreased by utilizing spontaneous heat during the milling, under reduced pressure or vacuum or spontaneous evaporation, milling with a strong load to the milling device can be carried out. It is preferred to add a suitably amount of dispersing medium to the milling material with a suitable interval to carry out milling under strong load for a long time.

When a large amount of dispersant is used, dispersibility of the dispersed material is improved but, in some cases, it exerts an influence upon various properties or a degree of milling.

When an amount of the dispersant is too little, grain stability after milling is poor and the dispersed material causes aggregation, so that it is necessary to add an appropriate amount.

In the present invention, the preferred amount of dispersant mixed with the plurality of fine particles, preferably a metallic oxide powder, is 2 to 50% by weight, preferably 3 to 30% by weight, particularly preferably 5 to 20% by weight.

A preferred range of the compound having a molecule with at least one thiirane ring to be used is not specifically limited, and it is generally 10 to 99.5 parts by weight, preferably 30 to 99 parts by weight based on 100 weight parts.

The photo acid generator, preferably an acid generation type cationic polymerization initiator, can be selected from the above-mentioned materials. It may be used singly or in combination of two or more. A preferred range of an amount of the photo acid generator, preferably the acid generation type cationic polymerization initiator, is not specifically limited, and it is generally 0.05 to 25 parts by weight, preferably 1 to 10 parts by weight based on 100 parts by weight. If the amount to be added is less than 0.05 parts by weight, sensitivity is insufficient, so that a remarkably large photo-irradiation energy or a high temperature treatment for a long period of time is required. Also, if it is added in excess of 25 parts by weight, improvement in sensitivity cannot be expected and economically undesirable. Moreover, uncured components remain in a coated film with a large amount, so that there is a possibility of lowering in physical properties of the cured product.

A preferred range of an amount of the plurality of fine particles having a high refractive index is 5 to 70 parts by weight based on 100 weight parts. If it is less than 5 parts by weight, an effect of increasing the refractive index is little, while if it exceeds 70 parts by weight, the structure tends to be brittle.

The photosensitive resin composition can be used by mixing with a solvent including, but not limited to, acetone, methyl ethyl ketone, methylene chloride, toluene, methanol, ethanol, propanol, butanol, methylene glycol, ethylene glycol, propylene glycol, ethylene glycol monomethyl ether and the like, or a mixed solvent of the above solvents, and the solution can be coated. The photosensitive resin composition may be diluted with an epoxy or thiirane compound having a low viscosity, and the mixture may be used as such without using any solvent.

The photosensitive resin composition after coating is preferably irradiated by an active light preferably using a rapid prototyping equipment, developed by a developer to give a cubic structure. When optical modeling is carried out without any solvent, a cubic structure can be obtained by rinsing an uncured portion by ethanol and the like.

As the active light to be used at this time, for example, those that can effectively irradiate ultraviolet rays, including, but not limited to, carbon arc lamp, ultra-high pressure mercury lamp, high-pressure mercury lamp, xenon lamp, and the like may be used. In addition, He-Cd laser, argon laser, or femto-second Ti-sapphire extreme pulse laser may be used. When the femto-second Ti-sapphire extreme pulse laser is used, a submicron order structure can be easily obtained by curing with a two-photon absorption reaction. At this time, an infrared region from 700 to 1000 nm can be used as an exposure wavelength. There is merit to easily transmitting light even when it is a fine particles-dispersed system.

As the developer, those that are safe and stable, and have good operatability, such as a solvent that can dissolve the uncured portion, can be used. As the developing method, there are a dipping system, a spray system, and the like, which can be preferably used.

The photosensitive resin composition can be used, for example, as an optical lens, a micro-lens array, a reflection preventive film, and other optical materials

EXAMPLES

Next, the present invention is explained by referring to Examples, but the present invention is not limited by these Examples.

Synthesis of a compound having a molecule with at least one thiirane ring is conducted as follows: Potassium thiocyanate (KSCN) (12.6 g) and 10 ml of water were added to 15.0 g of BREN-S (NIPPON KAYAKU CO., LTD.) and dissolved in 100 ml of 1,4-dioxane. The mixture was stirred for 24 h at room temperature. A new portion of KSCN (12.6 g) and 10 ml of water were added to the reaction mixture and stirred for 24 h at room temperature. The mixture was extracted with ethyl acetate, washed with water, and dried with $MgSO_4$. The solution was concentrated in vacuo and added to isopropanol in order to precipitate the product. The product was purified by reprecipitation from tetrahydrofuran (THF)/methanol. The yield of a thiirane-modified BREN-S was 12.8 g (80%). The degree of transformation to thiirane is 50% (±5) as calculated from $^1$H-NMR spectrum. δ2.0-2.6 (m, —$CH_2$—S—, 6.0H), δ2.4-2.8 (m, —$CH_2$—O—, 6.0H), 2.9-3.4 (m, —CH—S— and —CH—O— 6.0H), 3.5-4.2 (m, O—$CH_2$—C and Ar—$CH_2$-Ar, 21.5H), 6.8-7.8 (m, Ar—H, 20H).

Example 1 to 3 and Comparative Example 1

Component (A)/Component (B): diphenyl iodonium hexafluoroantimonate/3-(2'-benzimidazolyl)-7-N,N-diethylaminocoumarine (available from Aldrich Chemical Co.)/Component (D): dimethylformamide were formulated to give a resin solution. In addition, a series of resin solutions were prepared including Component (C): titanium oxide. The weight ratio of the components in the series of resin solutions was 50(A)/2(B)/1(C)/50(D). Formulations of the respective resin solutions are shown in Table 1.

TABLE 1

| | Formulation | |
|---|---|---|
| | Component A (formulated amount) | Component (C) |
| Example 1 | Thiirane-modified BREN-S | — |
| Example 2 | Thiirane-modified BREN-S | Titanium oxide (rutile) 5 vol % |
| Example 3 | Thiirane-modified BREN-S | Titanium oxide (rutile) 10 vol % |
| Comparative example 1 | BREN-S | — |

BREN-S: (brominated epoxy resin, available from Nippon Kayaku Co., Ltd.)

A refractive index of the photosensitive resin composition was measured by spin coating the resin solution shown in Table 1 on a silicon substrate by using an ellipsometer (manufactured by Rudolph Technologies Inc.). Measured wavelength was 830 nm.

Then, the resin solution was cast on a glass substrate and the solvent was removed by heating to 90° C. for 5 minutes. The resulting photosensitive resin composition was subjected to scanning exposure by using Ti-sapphire laser (Tsunami® manufactured by Spectra Physics Lasers, U.S.A., irradiation wavelength: 750 nm, pulse width: 100 femto-seccond or shorter). The sample after exposure was post-heated at 110° C. for 5 minutes, and washed with tetrahydrofuran to give the objective three-dimensional structure.

TABLE 2

Refractive index and resolution of the photosensitive resin composition

| | Refractive index (Measured wavelength: 830 nm) | Resolution |
| --- | --- | --- |
| Example 1 | 1.70 | 210 nm |
| Example 2 | 1.75 | 210 nm |
| Example 3 | 1.80 | 210 nm |
| Comparative example 1 | 1.62 | 210 nm |

As shown in Example 1 of Table 2, a refractive index was raised by modifying an epoxy resin to a compound having a molecule with at least one thiirane ring. Also, by mixing titanium oxide fine particles with the compound having a molecule with at least one thiirane ring, the refractive index could be further raised.

The photosensitive resin composition of the present invention has a high refractive index, and is suitable as a photosensitive material for an optical material.

In addition to the above effect, the photosensitive resin composition of the present invention can obtain a heightened refractive index by adding a plurality of fine particles having a high refractive index.

The photosensitive resin composition is a photosensitive material having a high refractive index, and is suitable for obtaining a high refractive index periodical structure with photolithography. FIG. 1 is an SEM image of a photonic crystal structure fabricated by two-photon lithography with highly focused laser pulses at 750 nm. The photonic crystal structure was formed using the photosensitive resin composition disclosed in Table 1, Example 1, which includes (A) thiirane-modified BREN-S and (B) diphenyl iodonium hexafluoroantimonate/3-(2'-benzimidazolyl)-7-N,N-diethylaminocoumarine. Two-photon lithography easily produces a submicron fine structure.

Although the present invention has been disclosed in terms of a preferred embodiment, it will be understood that numerous additional modifications and variations could be made thereto without departing from the scope of the invention as defined by the following claims:

What is claimed is:

1. A photosensitive resin composition comprising,
    (A) a compound having a molecule with at least two thiirane ring said molecule consisting of a thiirane-modified brominated phenol novolac type epoxy resin;
    (B) a photo acid generator, wherein said photo acid generator is selected from the group consisting of a sulflonium salt, an iodonuium salt, a phosphonium salt, a diazonium salt, an ammonium salt and a ferrocene; and
    (C) a plurality of fine particles having a refractive index of at least 2.0 and an average primary particle diameter of 1 to 100 nm.

2. The photosensitive resin composition of claim 1, whereby said composition has a refractive index of at least 1.6.

3. The photosensitive resin composition of claim 1, wherein said sulfonium salt is selected from the group consisting of bis[4-(diphenylsulfonio)phenyl]sulfide bishexafluorophosphate, bis[4-(diphenylsulfonio)phenyl]sulfide bishexafluoroantimonate, bis[4-(diphenyl-sulfonio)phenyl]sulfidebistetrafluoroborate, bis[4-(diphenylsulfonio)phenyl]sulfide tetrakis (pentafluorophenyl) borate, diphenyl-4-(phenylthio)phenylsulfonium hexafluorophosphate, diphenyl-4-(phenylthio) phenylsulfonium hexafluoroantimonate, diphenyl-4-(phenylthio) phenylsulfonium tetrafluoroborate, diphenyl-4-(phenylthio)phenylsulfonium tetrakis-(pentafluorophenyl)borate, triphenylsulfonium hexafluorophosphate, triphenylsulfonium hexafluoroantimonate, triphenylsulfonium tetrafluoroborate, triphenylsulfonium tetrakis (pentafluorophenyl)borate, bis[4-(di-(4-(2-hydroxyethoxy))phenylsulfonio)phenyl]sulfide bishexafluorophosphate, bis [4-(di-(4-(2-hydroxyethoxy))phenylsulfonio)phenyl]sulfide bishexafluoroantimonate, bis[4-(di-(4-(2-hydroxyethoxy))phenylsulfonio)phenyl]sulfide-bistetrafluoroborate, and bis [4-(di-(4-(2-hydroxyethoxy))phenylsulfonio)phenyl]sulfide tetrakis -(pentafluorophenyl)borate.

4. The photosensitive resin composition of claim 1, wherein said iodonium salt is selected from the group consisting of diphenyl iodonium hexafluorophosphate, diphenyl iodonium hexafluoroantimonate, diphenyl iodonium tetrafluoroborate, diphenyl iodonium tetrakis(pentafluorophenyl)borate, bis(dodecylphenyl)iodonium hexafluorophosphate, bis(dodecylphenyl)iodonium hexafluoroantimonate, bis(dodecylphenyl)iodonium tetra-fluoroborate, bis(dodecylphenyl)iodonium tetrakis(pentafluorophenyl)borate, 4-methylphenyl-4-(1-methylethyl)phenyl iodonium hexafluorophosphate, 4-methylphenyl-4-(1-methylethyl) phenyl iodonium hexafluoroantimonate, 4-methylphenyl-4-(1-methylethyl)-phenyl iodonium tetrafluoroborate, and 4-methylphenyl-4-(1-methylethyl)phenyl iodonium tetrakis (pentafluorophenyl)borate.

5. The photosensitive resin composition of claim 1, wherein said phosphonium salt is selected from the group consisting of ethyltriphenylphosphonium tetrafluoroborate, ethyltriphenylphosphonium hexafluorophosphate, ethyltriphenylphosphonium hexafluoroantimonate, tetrabutylphosphonium tetrafluoroborate, tetrabutylphosphonium hexafluorophosphate, and tetrabutylphosphonium hexafluoroantimonate.

6. The photosensitive resin composition of claim 1, wherein said diazonium salt is selected from the group consisting of phenyldiazonium hexafluorophosphate, phenyldiazonium hexafluoroantimonate, phenyldiazonium tetrafluoroborate, and phenyldiazonium tetrakis(pentafluorophenyl)borate.

7. The photosensitive resin composition of claim 1, wherein said ammonium salt is selected from the group consisting of 1-benzyl-2-cyanopyridinium hexafluorophosphate, 1-benzyl-2-cyanopyridinium hexafluoroantimonate, 1-benzyl-2-cyanopyridinium tetrafluoroborate, 1-benzyl-2-cyanopyridinium tetrakis(pentafluorophenyl)borate, 1-(naphthylmethyl)-2-cyano-pyridinium hexafluorophosphate, 1-(naphthylmethyl)-2-cyanopyridinium hexafluoroantimonate, 1-(naphthylmethyl)-2-cyanopyridinium tetrafluoroborate, and 1-(naphthylmethyl)-2-cyano-pyridinium tetrakis(pentafluorophenyl)borate.

8. The photosensitive resin composition of claim 1, wherein said ferrocene is selected from the group consisting of (2,4-cyclopentadien-1-yl)[(1-methylethyl)benzene]-Fe (II) hexafluorophosphate, (2,4-cyclopentadien-1-yl )[(1-methylethyl)benzene]-Fe (II) hexafluoro-antimonate, 2,4-cyclopentadien-1-yl )[(1-methylethyl)benzene]-Fe (II) tetrafluoroborate, and 2,4-cyclopentadien-1-yl )[(1-methylethyl) benzene]-Fe (II) tetrakis(pentafluorophenyl)borate.

9. The photosensitive resin composition of claim 1, wherein said composition has a refractive index of at least 1.7.

10. The photosensitive resin composition according to claim 9, wherein said composition is cured by irradiation of active energy light.

11. A method of obtaining a high refractive index periodical structure comprising subjecting the photosensitive resin composition of claim 10 to photolithography 12. A method of obtaining a high refractive index periodical structure comprising subjecting the photosensitive resin composition of claim 9 to photolithography.

13. The photosensitive resin composition of claim 1, wherein said plurality of fine particles has a surface coated with a metallic oxide compound.

14. The photosensitive resin composition of claim 13, wherein said metallic oxide compound is aluminum oxide or silicon oxide.

15. The photosensitive resin composition of claim 1, wherein said plurality of fine particles is a metal oxide powder or a metal salt powder.

16. The photosensitive resin composition of claim 15, wherein said plurality of fine particles is selected from the group consisting of titanium oxide, potassium titanate, barium titanate, zirconium oxide, lead titanate, zinc sulfide, and zinc oxide.

17. The photosensitive resin composition of claim 1, further comprising a dispersant to stabilize dispersibility of said plurality of fine particles.

18. The photosensitive resin composition of claim 17, wherein said dispersant is selected from the group consisting of a tripolyphosphate, a hexametaphosphate, a pyrophosphate, a naphthalene sulfonate-formalin condensate, a cresol sulfonate-formalin condensate, a polyacrylate, an olefin-maleate copolymerized material, an acryl-maleate copolymerized material a lingosulfonate, a carboxymethylcellulose salt, cationized starch, cationized cellulose, gelatin, dextrin, soluble starch, skim milk, polyvinyl alcohol, alkylbenzene sulfonate, sodium dioctylsulfosuccinate, a partially amidated or partially esterified product of an olefin/maleic anhydride copolymer, an alkylimidazoline, an alkyl amine acetate, an alkyldiamide, an alkylaliphatic acid salt and a rhodinic acid salt.

19. The photosensitive resin composition of claim 17, further comprising a dispersing medium for said plurality of fine particles.

20. The photosensitive resin composition of claim 19, wherein said dispersing medium is selected from the group consisting of water, an alcohol, a ketone, an ester, a halogenated hydrocarbon, an aromatic hydrocarbon, an amide, and an ether.

21. The photosensitive resin composition of claim 1, wherein said compound is 10 to 99.5 parts by weight based on 100 weight parts of the photosensitive resin composition.

22. The photosensitive resin composition of claim 21, wherein said compound is 30 to 99 parts by weight based on 100 weight parts of the photosensitive resin composition.

23. The photosensitive resin composition of claim 1, wherein said photoacid generator is 0.05 to 25 parts by weight based on 100 weight parts of the photosensitive resin composition.

24. The photosensitive resin composition of claim 23, wherein said photoacid generator is 1 to 10 parts by weight based on 100 weight parts of the photosensitive resin composition.

25. The photosensitive resin composition of claim 1, wherein said plurality of fine particles is 5 to 70 parts by weight based on 100 weight parts of the photosensitive resin composition.

26. The photosensitive resin composition of claim 1, further comprising a solvent.

27. The photosensitive resin composition of claim 26, wherein said solvent is selected from the group consisting of acetone, methyl ethyl ketone, methylene chloride, toluene, methanol, ethanol, propanol, butanol, methylene glycol, ethylene glycol, propylene glycol, and ethylene glycol monomethyl ether.

28. The photosensitive resin composition according to claim 1, wherein said composition is cured by irradiation of an active energy light.

29. A method of obtaining a high refractive index periodical structure comprising subjecting the photosensitive resin composition of claim 28 to photolithography.

30. A method of obtaining a high refractive index periodical structure comprising, subjecting said photosensitive resin composition of claim 1 to photolithography.

* * * * *

UNITED STATES PATENT AND TRADEMARK OFFICE
CERTIFICATE OF CORRECTION

PATENT NO. : 8,415,081 B2
APPLICATION NO. : 11/570733
DATED : April 9, 2013
INVENTOR(S) : Christopher K. Ober et al.

It is certified that error appears in the above-identified patent and that said Letters Patent is hereby corrected as shown below:

In the Claims

Column 9, claim 1, in line 59, change "ring" to -- rings --.

Column 9, claim 1, in lines 62-63, change "sulflonium" to -- sulfonium --.

Column 9, claim 1, in line 63, change "iodonuium" to -- iodonium --.

Signed and Sealed this
Thirtieth Day of July, 2013

Teresa Stanek Rea
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 8,415,081 B2 | Page 1 of 1 |
| APPLICATION NO. | : 11/570733 | |
| DATED | : April 9, 2013 | |
| INVENTOR(S) | : Christopher K. Ober et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1517 days.

Signed and Sealed this
Ninth Day of December, 2014

Michelle K. Lee
*Deputy Director of the United States Patent and Trademark Office*